United States Patent [19]

Sykora

[11] Patent Number: 5,133,136
[45] Date of Patent: Jul. 28, 1992

[54] METHOD OF AND APPARATUS FOR DRYING ARTICLES

[75] Inventor: Juergen Sykora, Rheinstrasse, Fed. Rep. of Germany

[73] Assignee: International Business Machines Corporation, Armonk, N.Y.

[21] Appl. No.: 569,042

[22] Filed: Aug. 17, 1990

[30] Foreign Application Priority Data

Sep. 15, 1989 [EP] European Pat. Off. ........ 89117081.3

[51] Int. Cl.$^5$ .............................................. F26B 5/04
[52] U.S. Cl. .......................................... 34/15; 34/92
[58] Field of Search ........................ 34/15, 17, 92, 60

[56] References Cited

U.S. PATENT DOCUMENTS

| 3,233,334 | 2/1966 | Hamilton . |
| 3,955,286 | 5/1976 | Anrep ................................. 34/1 |
| 4,592,847 | 6/1986 | Schumacher ...................... 210/770 |

FOREIGN PATENT DOCUMENTS

| 0218733 | 9/1985 | European Pat. Off. . |
| 0252439 | 2/1987 | European Pat. Off. . |
| 3111223 | 10/1982 | Fed. Rep. of Germany . |
| 2247388 | 10/1973 | France . |
| 60-165727 | 8/1985 | Japan . |
| 0193584 | 8/1989 | Japan .................................. 34/92 |

OTHER PUBLICATIONS

Baumeister, Standard Handbook for Mechanical Engineers, 1951, pp. 11-103 and 11-104.

Primary Examiner—Henry A. Bennet
Attorney, Agent, or Firm—Douglas R. Millett

[57] ABSTRACT

Method of and apparatus for drying articles (18), in particular articles which are used in electronics and require clean-room conditions for their manufacture. Drying according to the method of the invention uses a partial vacuum in a vacuum storage and at least one air blast across the article by opening the vacuum storage. The wetness on the article is blown off at high velocity. The air blast can be repeated until there is only a residual moisture left on the article. This moisture can be removed by evaporation in a partial vacuum. The drying apparatus comprises a process chamber (14) for the articles. The process chamber has air inlet openings (34) distributed over its transverse sectional area and at least one air outlet opening (26) positioned opposite the inlet openings. The apparatus also comprises a partial vacuum storage tank (16, 30) which is connected to the interior of the chamber via the outlet opening and a poppet-valve (28) which closes the entire outlet opening and is actuated to instantaneously open the entire outlet opening. The method and the apparatus allow a fast drying of articles under clean-room conditions. The apparatus is readily integratable into a clean-bench and the method allows automation of the drying operation. For drying the invention requires less energy and no chemicals harmful to the environment.

27 Claims, 1 Drawing Sheet

METHOD OF AND APPARATUS FOR DRYING ARTICLES

BACKGROUND OF THE INVENTION

This invention relates to a method of and an apparatus for drying articles, in particular articles which are used in electronics and which need clean-room conditions for their production.

DESCRIPTION OF THE PRIOR ART

It is well known in the art to dry articles with a centrifuge or with hot air. The use of a centrifuge involves additional materials, such as nitrogen, as a conveying medium, requires frequent cleaning of the centrifuge interior, and makes it difficult to automate drying. Further, only articles with flat surfaces can be dried. Drying with hot air requires compressed-air, which is difficult to obtain in the purity necessary for electronic components, or a closed system in which drying is accomplished by air circulation. The latter is very slow, calls for high energy, imparts impure residues to the dried articles, which is disadvantageous for the manufacture of electronic components. A further problem is the electrostatic charge.

Another well known drying method uses dichlorodifluormethane (Freon), which is an evaporation process. This method is very expensive, as the bath in which the articles are immersed before they reach a dichlorodifluormethane steam zone is easily polluted by object particles. A further, major disadvantage of this method is the use of dichlorodifluormethane which is very harmful to the environment.

A further well known method involves a vacuum drying process in which heated articles are exposed to an atmosphere which is evacuated by a partial vacuum. This method is not very fast and automation for manufacturing electronic components is complicated.

GB-A-1 530 642 discloses improvements relating to the application of liquid to a surface of sheet material. In order to control the application of the liquid, a vacuum causes an air flow in a space between the material and walls of a vessel which is passed by the sheet material. The air flow confines the liquid within the space in the vessel, with excess liquid being lifted from the material and removed from the space into the vessel by the vacuum. The degrees of vacuum and the viscosity of the liquid can be selected as desired so that the material may leave the vicinity of the vessel with its surface substantially dry or with a liquid coating of a desired thickness. This disclosure only allows handling sheet material and is directed to the application of a liquid.

A discussion of several drying techniques is also disclosed in Semiconductor International, July 1989, pp. 80-89, "Dry Wafers Clearly: Without Spinning".

SUMMARY OF THE INVENTION

Thus, the invention as claimed is intended to remedy these drawbacks. For this purpose, the invention provides for fast drying which can be readily automated and which allows drying without residues. The invention is preferably applicable to articles requiring clean-room conditions.

Accordingly, the method of drying articles uses a partial vacuum in a vacuum storage and at least one air blast across the article by instantaneously opening the vacuum storage. The articles are preferably electronic components which have a flat or rough surface with bores and undercuts. In a vacuum storage a partial vacuum relative to the surrounding atmosphere is established.

The amount of the partial vacuum depends on the velocity necessary to sufficiently dry the articles. Drying is achieved by blowing the wetness off the article at high velocity. Depending on the shape of the article, the air blast is repeated until the article is dry or there is only a moisture residue left which can be removed by an additional conventional drying step. The duration of each air blast depends on the opening velocity of the vacuum storage and its capacity.

In order to effectively sweep the water from the article, the velocity of the air in the blast should be at least 30 m/sec.

This velocity can be obtained and influenced by several factors, such as the partial vacuum in the vacuum storage, the opening time of the poppet-valve, preferably about 0.1 sec, and the environment of the article.

According to the invention, during the drying process, the article is located in a process chamber with an air inlet opening and an air outlet opening. The velocity of the air during the blast is influenced by the ratio of the opening areas of the air inlet opening to the air outlet opening. Depending on the arrangement of the articles, the opening area of the air inlet opening is smaller than the opening area of the air outlet opening, with the ratio of preferably about 1:3.

If the article has a form which does not allow complete removal of the wetness, the residual moisture is evaporated in a partial vacuum. This step is a known technique and used only if the liquid drops left on the article are not too large.

The apparatus for drying articles according to the invention comprises a process chamber for accommodating the articles. The process chamber has air inlet openings distributed over its transverse sectional area and at least one air outlet opening positioned opposite the inlet openings. Further, the apparatus comprises a partial vacuum storage tank connected to the interior of the chamber via the outlet opening and a poppet-valve which closes the entire outlet opening and is instantaneously actuated to open the entire outlet opening.

In the process chamber, one or more articles can be located to obtain a sufficient velocity of the air during the blast. For this purpose, the process chamber comprises several air inlet openings providing an air current across the entire transverse sectional area of the chamber at least in the region of the articles. The air inlet openings are positioned opposite the outlet opening for supporting the air current over the article.

The partial vacuum storage tank may be indirectly connected via a pipe or be directly linked with the interior of the chamber. The interior of the storage tank has a partial vacuum which is separated from the interior of the process chamber by a poppet-valve.

This valve allows a fast opening of the storage tank so that the partial vacuum in the tank sucks the air from the interior of the process chamber into the tank at high velocity. As the volume of the tank considerably exceeds that of the process chamber, the air outside the chamber is sucked through the inlet openings into the chamber and the tank until the tank is filled with air having the same pressure as the environment. As a result of the air movement, the articles are mechanically dried; in addition any remaining particles on the article are swept away by the air blast.

In a preferred embodiment of the invention the inlet openings are arranged in a plate covering a load opening in the chamber. Through the load opening, the articles are inserted into the interior of the chamber. Then, the opening is closed by the plate or any other appropriate means in which the inlet openings are arranged. This position is called processing position. If an additional drying step is required, the inlet openings are closed in the drying position. In this position the remaining moisture is removed by a partial vacuum. To accelerate the drying process in the drying position, a small inlet opening area may be provided in the plate. The air inlet openings for the drying position may be closed by moving the plate to another position or by closing all or several of the inlet openings by appropriate means.

For obtaining a high velocity, (at least 30 m/sec) the free air stream area of the processing chamber must always be greater than the total area of the inlet holes and the area of the poppet-valve opening. The poppet-valve is actuated pneumatically. Pneumatic actuation of the valve allows stepless variation of the opening velocity and fast and reliable operation from about 0.1 sec.

For adopting the apparatus according to the invention, for example, to a clean-bench, as used in the manufacture of electronic components, one embodiment of the invention provides for the partial vacuum storage tank to comprise an intermediate tank. This tank contains the poppet-valve and is directly connected to the processing chamber. In the latter case, the main tank having a greater volume than the intermediate tank, may be arranged remote from and connected by a pipe to the intermediate tank.

The apparatus may also comprise a control unit which allows the automation of the movements of the apparatus components and controlling the entire drying process according to the invention.

The method and the apparatus permit a fast drying of articles under clean-room conditions, as ambient air from the clean-room is used to generate the air blast. This cannot be done at reasonable expense by methods and apparatus known from the art.

A further advantage is the low energy consumption and the elimination of materials harmful to the environment.

Another advantage of the invention is that the drying time is reduced and that articles having different sizes and surfaces can be dried in the same apparatus. Electrostatic charge is avoided. For example, for wafers for electronic components, the drying time with a centrifuge or hot compressed air is respectively two to three times that of the present invention. Thus, the cost factor for drying with a centrifuge or compressed hot air exceeds that of the method of the invention by more than 100. Still another advantage of the invention is that the apparatus is simple to integrate into a clean-bench and that the method allows ready automation of the drying process.

Using a partial vacuum has the advantage that a velocity is obtained which normally would require a much higher pressure. Such high pressure meeting clean-room conditions is difficult to obtain with reasonable effort.

For a fuller understanding of the nature and advantages of the present invention reference should be made to the following detailed description taken in conjunction with the accompanying drawings.

BRIEF DESCRIPTION OF THE PREFERRED EMBODIMENTS

Figure 1:
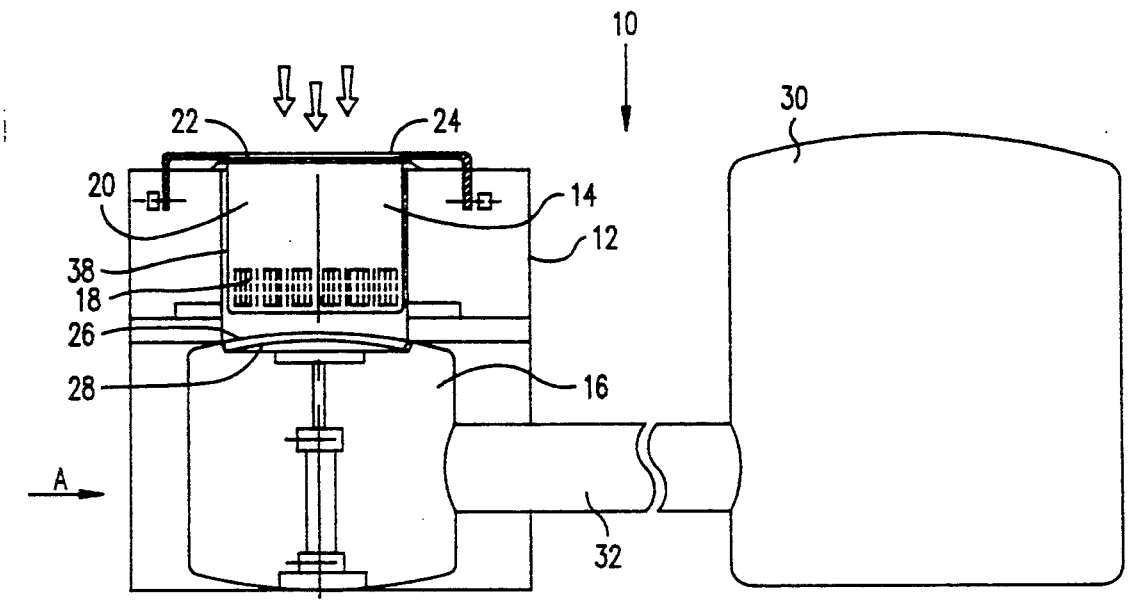
FIG. 1 is a cross-sectional sketch of an apparatus according to the invention, comprising an intermediate partial vacuum storage tank inserted between a process chamber and the main partial vacuum storage tank.
Figure 2:
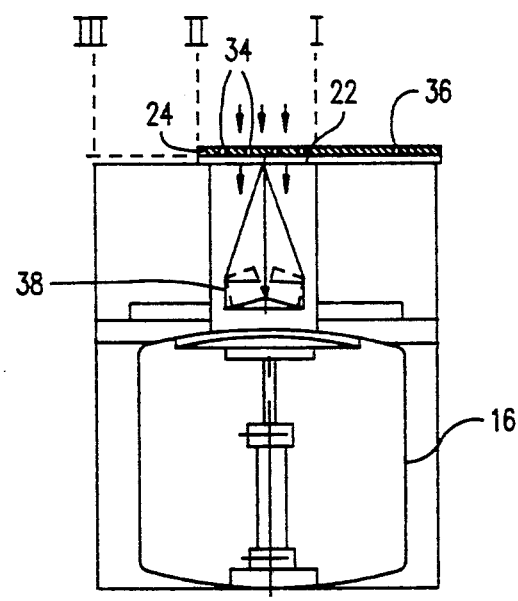
FIG. 2 is an enlarged sectional view of the apparatus in the direction of arrow A in FIG. 1.

In FIG. 1, the apparatus 10 for drying particles comprises a housing 12 which contains a process chamber 14 and an intermediate partial vacuum storage tank 16. The process chamber 14 is located above the storage tank 16 and contains articles 18 for drying which are inserted into the interior 20 of the chamber through load opening 22. Load opening 22 is closed by a slidable plate 24 which has three working positions as shown in FIG. 2 and as described below. The means which provides the sliding and closing of the plate 24 is commonly known in the industry. The bottom of the process chamber has an air outlet opening 26 which is closed by poppet-valve 28 arranged in the intermediate tank 16 and actuated pneumatically with a method known from the art. Intermediate tank 16 is connected to a main partial vacuum storage tank 30 by a pipe 32. The arrangement according to the preferred embodiment allows integrating process chamber 14 and intermediate tank 16 in a clean-bench to provide clean-room conditions for the wet articles 18 in the process chamber 14. The main tank can then be placed remote from the clean-bench in a supply room.

The three working positions of plate 24 are shown in FIG. 2. Plate 24 allows ready automation of the drying process. As mentioned above, plate 24 has three working positions I, II, and III. In position I, load opening 22 is not closed by plate 24 for inserting or removing the articles 18. In position II, plate 24 covers process chamber 14. A part of plate 24 which is above load opening 22 has a number of inlet holes 34 which are distributed over the entire transverse sectional area of process chamber 14 and load opening 22. This has the effect that the air sucked into the chamber is forced as a blast across articles 18 in chamber 14. The opening area of plate 24 should be arranged such as to provide an even air flow over the articles in the process chamber. In position III, plate 24 covers process chamber 14 with only one hole 36. In this position, the residual moisture from article 18 is removed by a vacuum. Hole 36 is not absolutely necessary but accelerates the drying process, as a predetermined amount of ambient air is sucked across the articles. In certain arrangements, it may be necessary to provide the 3 positions (I-III) with individual multiple plates. The articles are held in place with a suspended basket 38.

The entire loading and drying process according to the invention can be automated. Thus, during operation, plate 24 is initially in position I and poppet-valve 28 closes air outlet opening 26. The wet articles are inserted by appropriate and well-known means into process chamber 14. Subsequently, plate 24 moves from position I to position II and a known vacuum pump (not shown) evacuates the two partial vacuum storage tanks 16 and 30 at, for example, 0.3 bar or a pressure difference of 0.7 bar over ambient pressure. Then, poppet-valve 28 opens pneumatically within about 0.1 sec. and provides an air blast over the articles in the chamber wherein the velocity of the air reaches a min. of 30 m/sec. The velocity is influenced by the the total area of the holes 34 in plate 24 and the opening area 22 and the opening area of air outlet opening 26.

At a tank volume of about 500 l, the duration of the air blast is about 1 sec. The poppet-valve then closes outlet opening 26 in case the articles have a rough surface with bores, etc., and the evacuation process of the tank and the subsequent opening of the valve can be repeated as required. The wetness on the articles is removed by the air blast. Residual moisture, if any, which depends on the surface of the articles, can be removed by retaining poppet-valve 28 in its open position after the air blast and by moving plate 24 to position III. In the following process, the vacuum pump evacuates the entire volume of tank and chamber and the moisture residue is evaporated in a partial vacuum of about 20 to 50 mbar. With the method and the apparatus according to the invention the processing time for drying an article with surfaces having a plurality of holes and undercuts is significantly reduced and requires less energy than with the currently known techniques. The partial vacuum ensures an air velocity that would otherwise necessitate a much higher pressure. The compressed-air necessary for this purpose does not meet clean-room conditions.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. An apparatus for drying articles, comprising:
a process chamber in which said articles are located, said process chamber having air inlet openings distributed over its transverse sectional area and at least one air outlet opening positioned opposite said inlet openings, wherein said inlet openings are arranged in a plate covering a load opening in said chamber and having a processing position (II) and a loading position (I) in which said articles can be inserted into said chamber;
a partial vacuum storage tank which is connected to the interior of said chamber via said outlet opening; and
a poppet-valve closing the entire outlet opening and being adapted to open instantaneously said entire outlet opening.

2. An apparatus for drying articles, comprising:
a processing chamber in which said articles are located, said process chamber having air inlet openings distributed over its transverse sectional area and at least one air outlet opening positioned opposite said inlet openings, wherein the ratio of the opening area of said air inlet openings to said air outlet opening is about one to three;
a partial vacuum storage tank which is connected to the interior of said chamber via said outlet opening; and
poppet-valve closing the entire outlet opening and being adapted to open instantaneously said entire outlet opening.

3. An apparatus for drying articles, comprising:
a process chamber in which said articles are located, said process chamber having air inlet openings distributed over its transverse sectional area and at least one air outlet opening positioned opposite said inlet openings;
a partial vacuum storage tank which is connected to the interior of said chamber via said outlet opening; and
poppet-valve closing the entire outlet opening and being adapted to open instantaneously said entire outlet opening; and
wherein said partial vacuum storage tank comprises an intermediate tank which is connected to a main tank and contains said poppet-valve.

4. A method of drying articles, comprising the steps of:
generating a partial vacuum in a vacuum storage tank;
placing an article to be dried in a process chamber, the process chamber having a valve regulated first aperture connecting the process chamber to the storage tank, and a second aperture positioned opposite the first aperture and connecting the process chamber with an ambient atmosphere such that the process chamber is in constant communication with the ambient atmosphere; and
removing the wetness from the article to be dried by generating at least one air blast across said article by opening the valve regulated first aperture.

5. An apparats for drying articles, comprising:
a partial vacuum storage tank;
a process chamber in which said articles are located, the process chamber having a first aperture connecting the process chamber to the storage tank, and a second aperture positioned opposite the first aperture and connecting the process chamber with an ambient atmosphere such that the process chamber is in constant communication with the ambient atmosphere; and
a valve located across the first aperture and being adapted to open, thereby allowing a blast of air to pass through the process chamber.

6. The apparatus according to claim 5, wherein the second aperture having a processing position (II) and a loading position (I) in which the is located in a plate covering a load opening in the chamber, the plate articles can be inserted into the chamber.

7. The apparatus according to claim 6, wherein said plate has a further drying position (III) in which said load opening is completely or almost completely closed.

8. The apparatus according to claim 5, wherein the ratio of the area of said second aperture to the area of said first aperture is about one to three.

9. The apparatus according to claim 5, wherein the valve is a poppet-valve and is actuated pneumatically and opens within about 0.1 seconds.

10. The apparatus according to claim 5, wherein said partial vacuum storage tank comprises an intermediate tank which is connected to a main tank and contains the valve.

11. The apparatus according to claim 10, wherein the main tank has a greater volume than the intermediate tank.

12. The apparatus according to claim 5, wherein the area of the second aperture is less than the area of the first aperture.

13. The apparatus according to claim 5, wherein the volume of the partial vacuum storage tank is greater than the volume of the process chamber.

14. The apparatus according to claim 5, wherein the valve is a poppet-valve.

15. The method according to claim 4, wherein the velocity of the air during said air blast is at least 30 m/sec.

16. The method according to claim 4 wherein the velocity of said air during said air blast is varied by the partial vacuum in said vacuum storage tank.

17. The method according to claim 4, wherein the velocity of said air during said air blast is varied by the velocity of the opening of the valve regulated first aperture of the vacuum storage tank.

18. The method according to claim 4, wherein the time for opening the valve regulated first aperture is about 0.1 sec.

19. The method according to claim 4, wherein the velocity of said air during said air blast is varied by the ratio of the area of the second aperture to the area of the first aperture.

20. The method according to claim 4, wherein the ratio of the area of the second aperture to the area of the first aperture is about one to three.

21. The method according to claim 4, further including the step of evaporating any residual moisture in a partial vacuum.

22. The method according to claim 21, wherein the evaporation is accelerated by regulated inlet of ambient air through the second aperture.

23. The method according to claim 4, wherein said partial vacuum storage tank comprises an intermediate tank which is connected to a main tank and contains the valve.

24. The method according to claim 23, wherein the main tank has a greater volume than the intermediate tank.

25. The method according to claim 4, wherein the area of the second aperture is less than the area of the first aperture.

26. The method according to claim 4, wherein the volume of the partial vacuum storage tank is greater than the volume of the process chamber.

27. The method according to claim 4, wherein the valve is a poppet-valve.

* * * * *

UNITED STATES PATENT AND TRADEMARK OFFICE
CERTIFICATE OF CORRECTION

PATENT NO. : 5,133,136

DATED : July 28, 1992

INVENTOR(S) : Juergen Sykora

It is certified that error appears in the above-identified patent and that said Letters Patent is hereby corrected as shown below:

Column 5, Line 52, delete "processing", and insert -- process --

Column 6, Line 41, after 'aperture', insert -- is located in a plate covering a load opening in the chamber, the plate --

Column 6, Lines 42-43, after 'in which the', delete "is located in a plate covering a load opening in the chamber, the plate"

Signed and Sealed this

Twenty-eighth Day of September, 1993

Attest:

BRUCE LEHMAN

*Attesting Officer*

*Commissioner of Patents and Trademarks*